(12) United States Patent
Lin et al.

(10) Patent No.: US 8,389,402 B2
(45) Date of Patent: Mar. 5, 2013

(54) METHOD FOR VIA FORMATION IN A SEMICONDUCTOR DEVICE

(75) Inventors: Chih Ching Lin, Taoyuan (TW); Yi Nan Chen, Taipei (TW); Hsien Wen Liu, Luzhu Township (TW)

(73) Assignee: Nanya Technology Corporation, Kueishan, Tao-Yuan Hsien, (TW)

( * ) Notice: Subject to any disclaimer, the term of this patent is extended or adjusted under 35 U.S.C. 154(b) by 56 days.

(21) Appl. No.: 13/116,432

(22) Filed: May 26, 2011

(65) Prior Publication Data

US 2012/0302062 A1 Nov. 29, 2012

(51) Int. Cl.
*H01L 21/4763* (2006.01)
(52) U.S. Cl. .............. 438/638; 438/734; 257/E21.579
(58) Field of Classification Search .......... 438/638, 438/637, 734, 700; 216/45, 48
See application file for complete search history.

(56) References Cited

U.S. PATENT DOCUMENTS

| 6,864,021 B2 * | 3/2005 | Iwasaki et al. ............ 430/5 |
| 2006/0118968 A1 * | 6/2006 | Johnston et al. ........... 257/775 |
| 2007/0231752 A1 * | 10/2007 | Lai ........................ 430/330 |

* cited by examiner

*Primary Examiner* — Charles Garber
*Assistant Examiner* — Reema Patel
(74) *Attorney, Agent, or Firm* — Novak Druce Connolly Bove + Quigg LLP

(57) ABSTRACT

A method of via formation in a semiconductor device includes the following steps of providing a photoresist with a photoresist pattern defining an opening of a via, wherein the photoresist comprising a thermally cross-linking material is disposed on a structure layer; dry-etching the structure layer to a first depth through the opening; baking the thermally cross-linking material to reduce the opening; and dry-etching the structure layer to a second depth through the reduced opening, wherein the second depth is greater than the first depth.

11 Claims, 5 Drawing Sheets

METHOD FOR VIA FORMATION IN A SEMICONDUCTOR DEVICE

DESCRIPTION

1. Technical Field

The present disclosure relates to a method for via formation, More particularly, the present disclosure relates to a method for via formation in a semiconductor device.

2. Background

The fabrication of integrated circuits on a semiconductor substrate typically includes multiple photolithography steps. A photolithography process begins with application of a thin layer of a photoresist material to the substrate surface. The photoresist is then exposed through a photolithography exposure tool to a radiation source that changes the solubility of the photoresist at areas exposed to the radiation. The photolithography exposure tool typically includes transparent regions that do not interact with the exposing radiation and a patterned material or materials that do interact with the exposing radiation, either to block it or to shift its phase.

"Masks" and "reticles" are types of lithography exposure tools, that is, tools that alter radiation to print an image on the exposed surface. The term "mask" is sometimes reserved for photolithography exposure tools that print an entire wafer in one exposure, and the term "reticle" is sometimes reserved for a photolithography exposure tool that projects a demagnified image and prints less than the entire wafer during each exposure. No matter what kinds of lithography exposure tools are used, the more lithography exposure tools the fabrication process uses, the more cost-ineffective it is, particularly if cost is a consideration.

Due to ever-increasing density in ULSI (ultra-large-scale integration) circuits, various techniques have been proposed to overcome the limits of the present semiconductor fabrication technology. For example, reduction in size of a contact via or through silicon via (TSV) has been actively pursued below the resolution limits of the current optical lithography technology.

To form a contact via or TSV, optical lithography technology has been conventionally used to form a photoresist pattern. Using the photolithography technique, patterns of a mask are transferred onto a photoresist applied on a semiconductor substrate. The photoresist is subjected to development after patterns are transferred thereto. Next, the underlying semiconductor substrate is etched using the developed photoresist pattern.

There have been various attempts to solve the resolution problem. Particularly, the extension of the optical lithography technology for sub-0.18 nm contact via lithography has been attempted. Accordingly, a need exists for a simplified and more practical method of forming a photoresist pattern for via formation under the 0.18 nm design rule. Particularly, a need exists for a method allowing precise critical dimension control using conventional optical lithography equipment such as an inexpensive i-line lithography system.

SUMMARY

To solve the problems of the above-mentioned prior art, the present disclosure discloses a method of via formation in a semiconductor device. The method comprises the following steps of providing a photoresist with a photoresist pattern defining an opening of a via, wherein the photoresist comprising thermally cross-linking material is disposed on a structure layer; dry-etching the structure layer to a first depth through the opening; baking the thermally cross-linking material to reduce the opening; and dry-etching the structure layer to a second depth through the reduced opening, wherein the second depth is greater than the first depth.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or to processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the disclosure.

DETAILED DESCRIPTION

FIGS. 1 through 5 are cross-sectional views illustrating a method for via formation in accordance with one embodiment of the present disclosure.

Particularly, disclosed herein is a method for post lithographic critical dimension shrinking to form a via structure with greater speed and lower power consumption. It should be understood that the description of the various aspects of the present disclosure are merely illustrative and that they should not be taken in a limiting sense.

Figure 1:
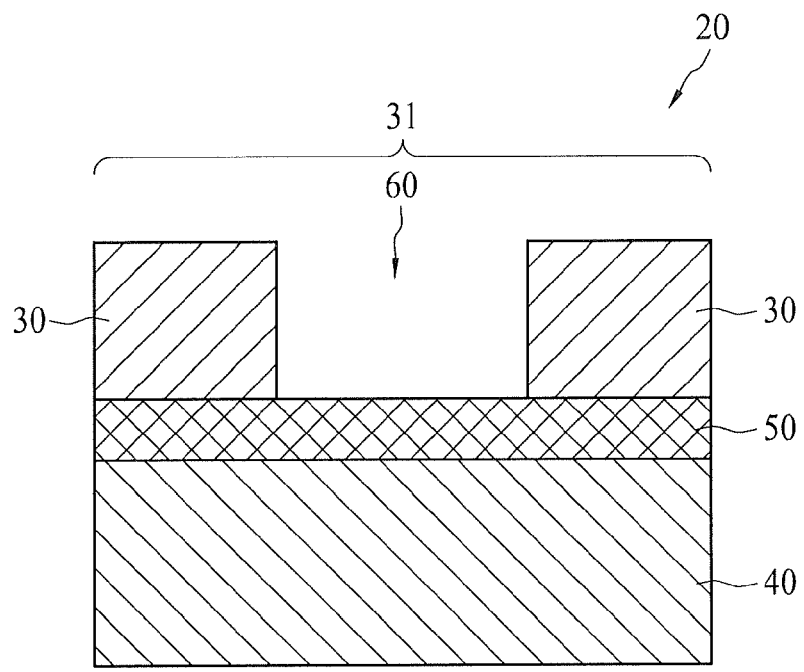
FIGS. 1 through 6 illustrate a method for forming a via in a semiconductor device in accordance with one embodiment of the present disclosure.

Referring to FIG. 1, a structure 20 having a thick photoresist layer 30 comprising a thermally cross-linking material is disposed over a structure layer 40. In this embodiment of a via fabrication method shown in FIGS. 1 through 5, an anti-reflection coating layer 50 is disposed between the photoresist layer 30 and a structure layer 40. However, in another embodiment (not shown), the anti-reflection coating layer 50 can be ignored. In addition, the structure layer 40 is selected from the group consisting of a metal layer, a polysilicon layer, a semiconductor layer, and an insulation layer. In this embodiment, the structure layer 40 is a semiconductor layer.

The thick photoresist layer 30 is formed on the anti-reflection coating layer 50 as illustrated in FIG. 1. The thick photoresist layer 30 has a thickness of about 1000 Å to 15,000 Å; however, it should be understood that the thickness of the photoresist layer 30 may be of any dimension suitable for carrying out the present disclosure. Accordingly, the thickness of the thick photoresist layer 30 can vary in correspondence with the wavelength of radiation used to pattern the thick photoresist layer 30. The anti-reflection coating layer 50 has a thickness within the range of about 10 Å to 200 Å. Preferably, the anti-reflection coating layer 50 material includes TiN. However, it should be understood that any material suitable for carrying out the present disclosure may be employed and is intended to fall within the scope of the present disclosure.

Referring to FIG. 1, the photoresist layer 30 has been exposed to radiation and formed a pattern 31 after lithography. The lithographic pattern 31 defines an opening 60 of a via (not shown). Thus, a photoresist 30 forming a photoresist pattern 31 defining an opening 60 is provided. In another embodiment (not shown), the photoresist pattern 31 can be directly disposed on the structure layer 40.

Figure 2:
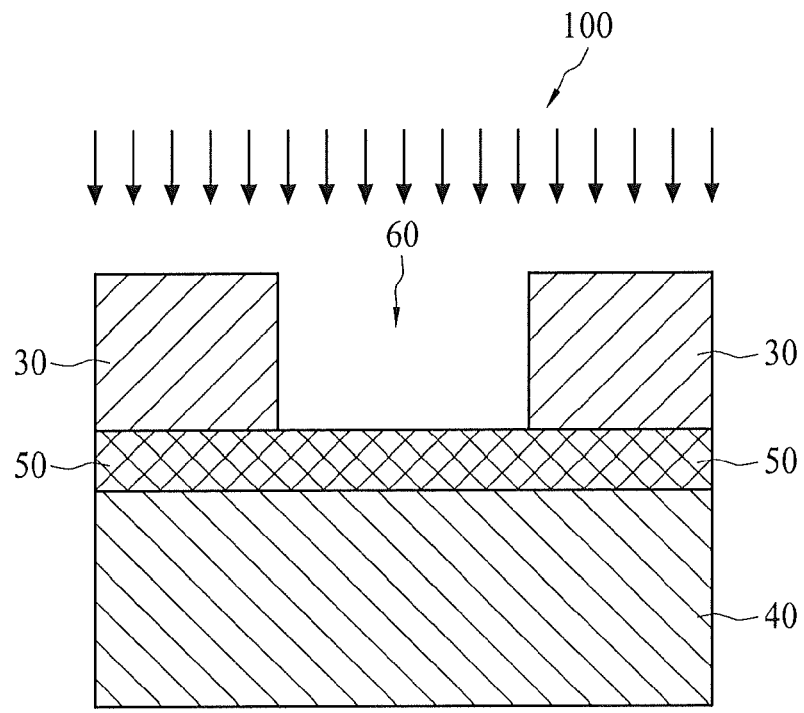
Figure 3:
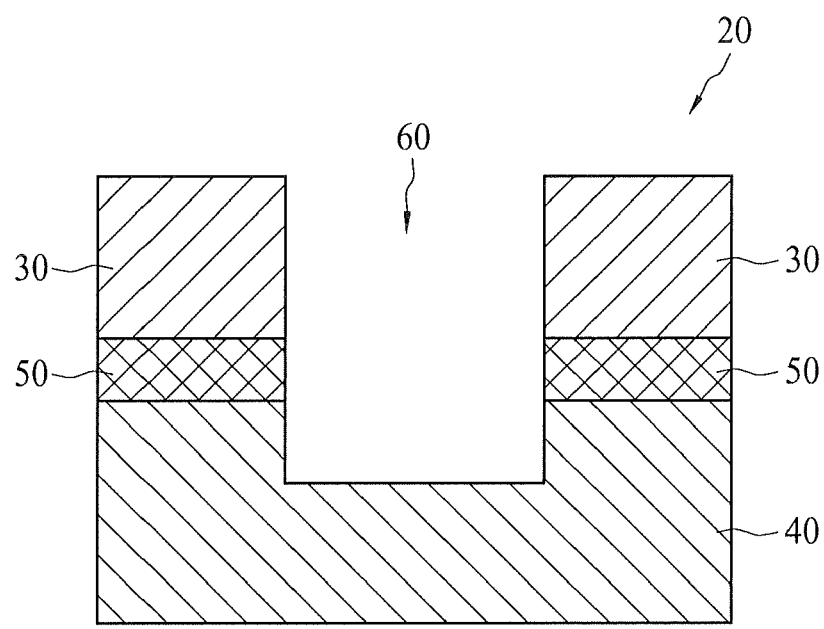

In the dry-etch step 100 (e.g., anisotropic reactive ion etching (RIE)) shown in FIG. 2, the opening 60 is dry-etched through the anti-reflection coating layer 50 to a first depth of the structure layer 40 shown in FIG. 3. In other words, a dry-etch step 100 is performed to form an opening 60 in the photoresist layer 30, the anti-reflection coating layer 50, and the structure layer 40 (FIG. 3). The photoresist layer 30 is patterned earlier and is used as a mask for selectively etching the anti-reflection coating layer 50 and the structure layer 40 to provide the opening 60 in the anti-reflection coating layer 50 and the structure layer 40. Preferably, a selective etch technique is used to etch the material of the anti-reflection coating layer 50 at a relatively greater rate as compared to the rate at which the material of the photoresist layer 30 is etched. Any suitable etch technique may be used to etch the anti-reflection coating layer 50 and the structure layer 40. For example, the anti-reflection coating layer 50 and the structure layer 40 at the opening 60 are anisotropically etched with a plasma gas (or gases) (which in one embodiment can be carbon tetrafluoride ($CF_4$) containing fluorine ions) in a commercially available etcher, such as a parallel plate RIE apparatus or an electron cyclotron resonance (ECR) plasma reactor, to replicate the pattern 31 of the photoresist layer 30 to create the opening 60 in the anti-reflection coating layer 50 and the structure layer 40. Preferably, a selective etch technique is used to etch the material of the anti-reflection coating layer 50 and the structure layer 40 at a relatively greater rate as compared to the rate at which the material of the patterned photoresist 30 is etched. The structure layer 40 is partially etched so that a portion of the semiconductor material remains below the opening 60.

Figure 4:
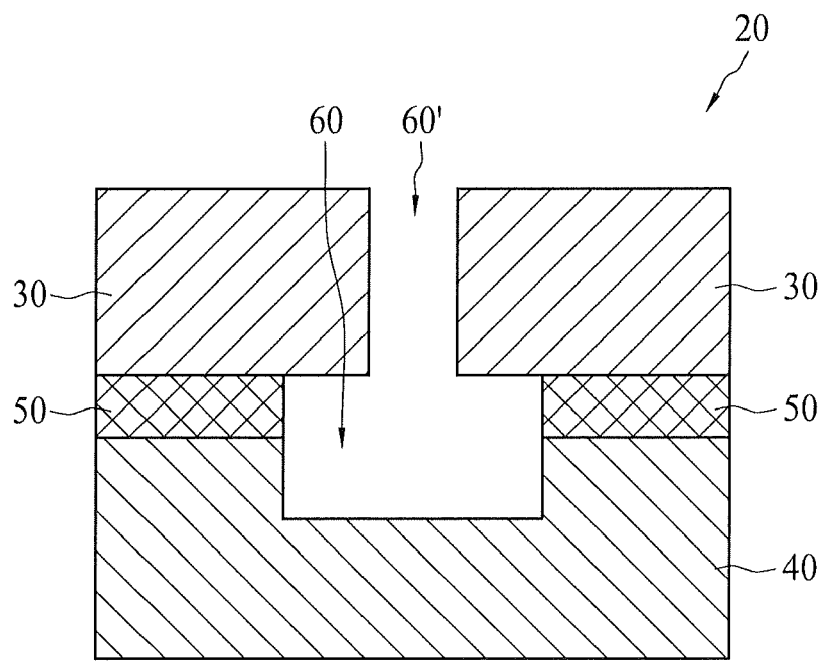
Figure 5:
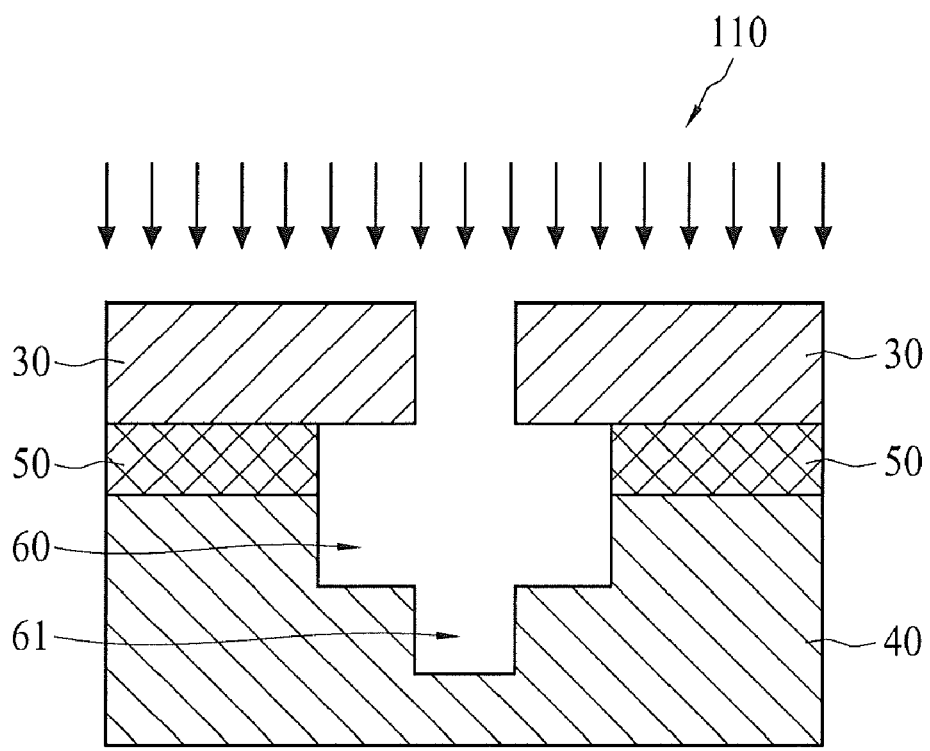

In FIG. 4, the photoresist 30 comprising thermally cross-linking material is radiated within a wavelength range which allows to implement a resolution enhancement of lithography by assist of chemical shrink (RELACS) process to enlarge the thermally cross-linking material so that the photoresist 30 shrinks a portion of the opening 60 exposing the underlying structure layer 40. The thermally cross-linking material can be enlarged by increasing its temperature for cross-linking. In addition, the thermally cross-linking material can also be enlarged by wetting the material with a solvent or by treating the material with an organic agent, such as a saturated hydrocarbon (e.g., aliphatic or aromatic hydrocarbon). Alternatively, the thermally cross-linking material can be a hydrophilic resin with swelling properties. The enlarged photoresist 30 shrinks the opening 60 to an opening 60'. The size of the opening 60' is smaller than the size of the opening 60. It should be understood that other known methods for enlarging the material may be employed. In other words, the thermally cross-linking material is baked to reduce the original opening 60 to the new opening 60' for defining a critical dimension area. The RELACS process can save additional mask for the second dry-etching step and simultaneously solve the resolution problem of the opening 60'. Therefore, the method for via formation is cost-effective, particularly if cost is a consideration.

A second dry-etch step 110 (e.g., anisotropic reactive ion etching (RIE)) (FIG. 5) is performed to form a reduced opening 61 in the structure layer 40. In other words, a second dry-etch step 110, through the reduced opening 61, etches the structure layer 40 to a second depth, which is greater than the first depth. Any suitable etch technique may be used to etch the structure layer 40. For example, the structure layer 40 at the reduced opening 61 is anisotropically etched with a plasma gas (or gases) (which in one embodiment can be carbon tetrafluoride ($CF_4$) containing fluorine ions) in a commercially available etcher, such as a parallel plate RIE apparatus or an electron cyclotron resonance (ECR) plasma reactor. Preferably, a selective etch technique is used to etch the material of the structure layer 40 at a relatively greater rate as compared to the rate at which the material of the photoresist layer 30.

Figure 6:
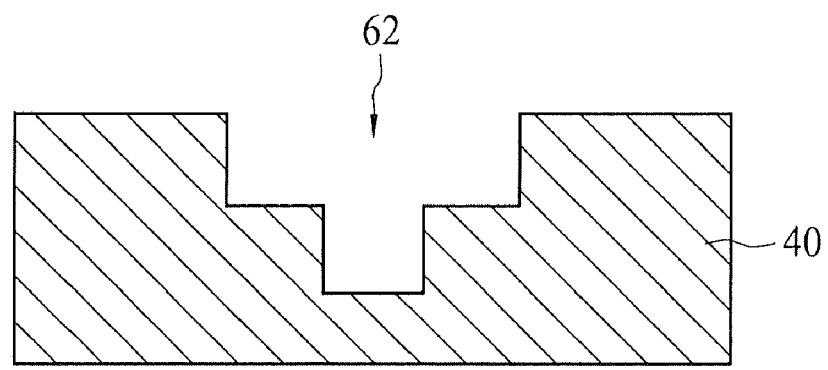
Figure 7:
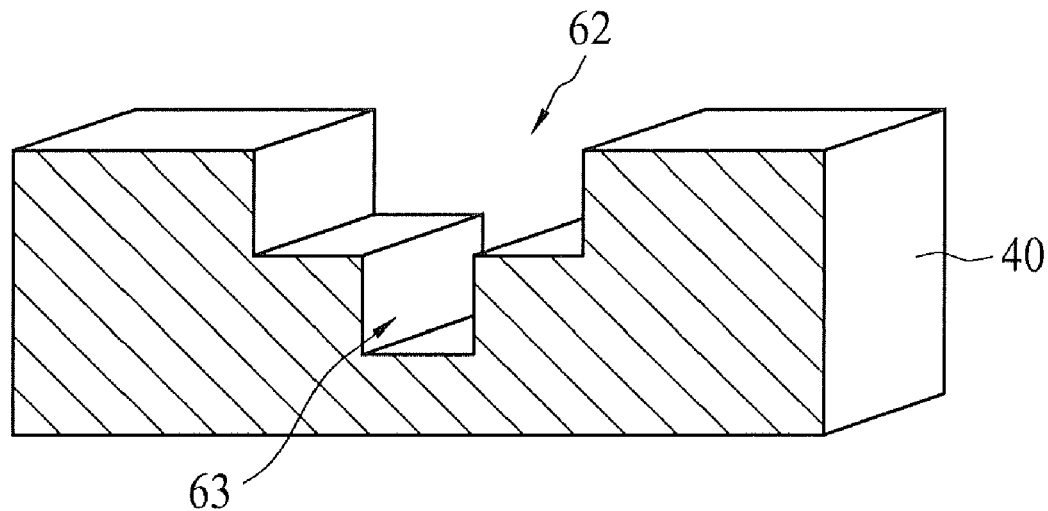
FIG. 7 illustrates a via structure with a linewidth in accordance with one embodiment of the present disclosure.
Figure 8:
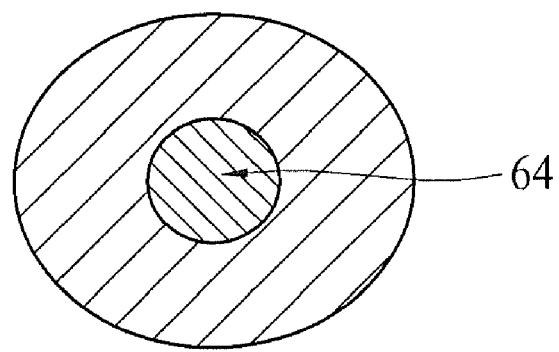
FIG. 8 illustrates a via structure with a hole in accordance with one embodiment of the present disclosure.

FIG. 6 illustrates a complete via structure 62 after a stripping step (e.g., ashing in an $O_2$ plasma) is completed for removing the remaining portions of the photoresist layer 30 and the anti-reflection coating layer 50. In other words, the photoresist 30 and anti-reflection coating layer 50 are removed for completing the via structure 62 shown in FIG. 6. In FIG. 7, the method for via 62 formation including the above-mentioned steps can form a trench 63 in the structure layer 40 under the anti-reflection coating layer (not shown); consequently, the method can perform a line-width fabrication method. Alternatively, since the second depth etching step forming the above-mentioned trench 63 can also form a hole 64 in the structure layer 40 shown in FIG. 8, the fabricating method can form a semiconductor via structure.

Figure 9:
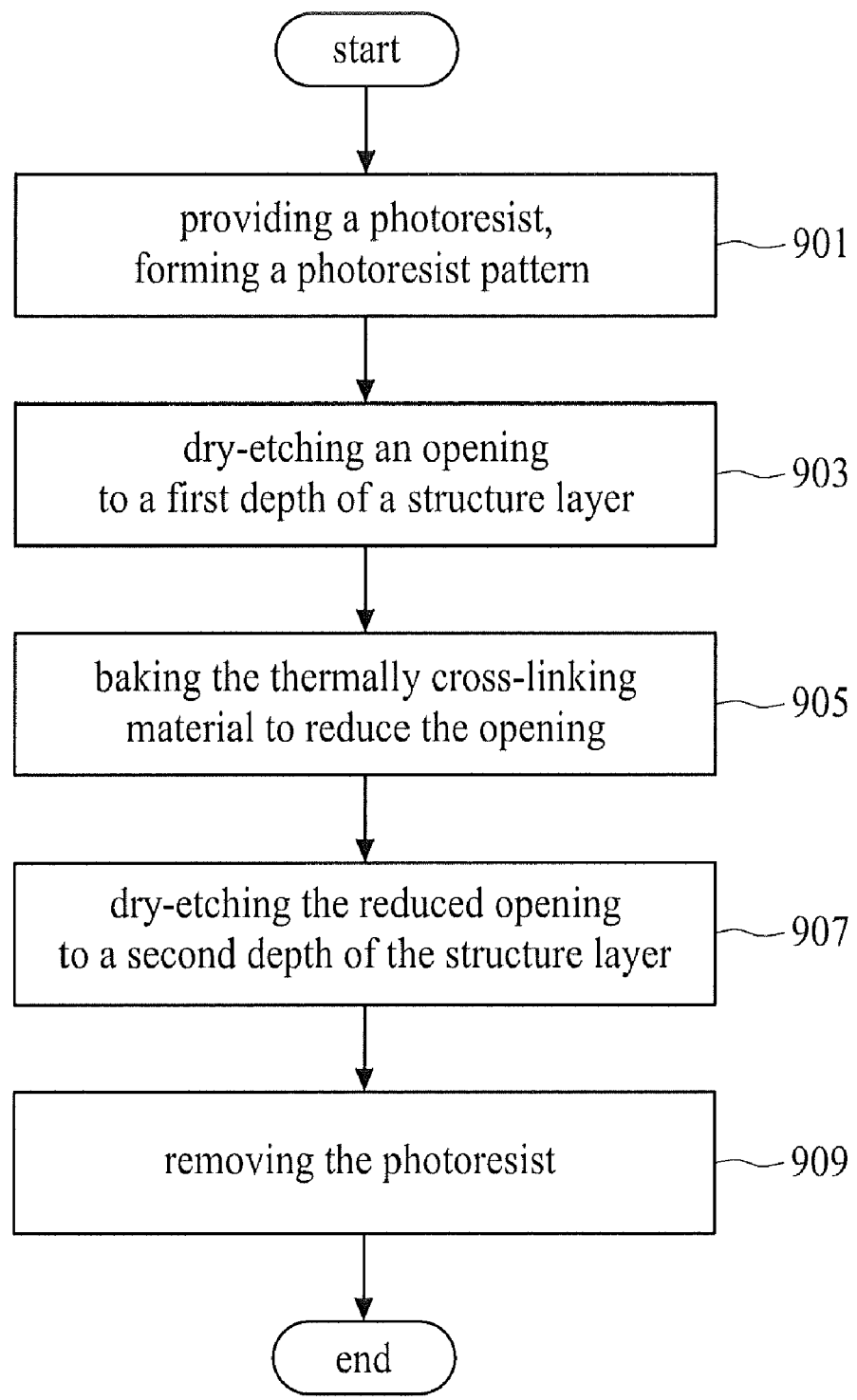
FIG. 9 shows a flow chart of the method of via formation in a semiconductor device in accordance with one embodiment of the present disclosure.

In conclusion, as shown in FIG. 9, the present disclosure provides the method of via formation in semiconductor comprising the following steps: In step 901, a photoresist is provided and forms a photoresist pattern defining an opening of a via, wherein the photoresist is disposed on a structure layer and step 903 is executed. In step 903, the opening is dry-etched to a first depth of the structure layer and step 905 is executed. In step 905, the thermally cross-linking material is baked to reduce the opening and step 907 is executed. In step 907, the reduced opening is dry-etched to a second depth of the structure layer, wherein the second depth of the structure layer is greater than the first depth of the structure layer. Finally, in step 909, the photoresist within the thermally cross linking material is removed to complete the via structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of via formation in a semiconductor device, the method comprising the steps of;
   providing a photoresist with a photoresist pattern defining an opening of a via, wherein the photoresist is disposed on a structure layer, wherein the photoresist comprises a thermally cross-linking material;
   dry-etching the structure layer to a first depth through the opening;
   baking the thermally cross-linking material to reduce the opening; and
   dry-etching the structure layer to a second depth through the reduced opening, wherein the second depth is greater than the first depth.

2. The method of claim 1, further comprising a step of forming an anti-reflection coating layer between the photoresist and the structure layer.

3. The method of claim 2, wherein the step of dry-etching the structure layer comprises dry-etching the anti-reflection coating layer to the first depth of the structure layer.

4. The method of claim 2, wherein the second depth etching step comprises forming a trench in the structure layer under the anti-reflection coating layer.

5. The method of claim 2, wherein the second depth etching step comprises forming a hole in the structure layer under the anti-reflection coating layer.

6. The method of claim 1, wherein the structure layer is a metal layer.

7. The method of claim 1, wherein the structure layer is a polysilicon layer.

8. The method of claim 1, wherein the structure layer is a semiconductor layer.

9. The method of claim 1, wherein the structure layer is an insulation layer.

10. The method of claim 1, further comprising a step of removing the photoresist.

11. The method of claim 2, further comprising a step of removing the photoresist and the anti-reflection coating layer.

* * * * *